(12) United States Patent
Chitaka et al.

(10) Patent No.: US 9,309,907 B2
(45) Date of Patent: Apr. 12, 2016

(54) STRUCTURE FOR FIXING SUBSTRATE

(71) Applicant: DENSO CORPORATION, Kariya, Aichi-pref. (JP)

(72) Inventors: Hiroki Chitaka, Kariya (JP); Masaru Yokota, Chiryu (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/394,430

(22) PCT Filed: Feb. 14, 2013

(86) PCT No.: PCT/JP2013/000789
§ 371 (c)(1),
(2) Date: Oct. 14, 2014

(87) PCT Pub. No.: WO2013/161142
PCT Pub. Date: Oct. 31, 2013

(65) Prior Publication Data
US 2015/0078818 A1  Mar. 19, 2015

(30) Foreign Application Priority Data
Apr. 25, 2012  (JP) .................................. 2012-100011

(51) Int. Cl.
*F16B 7/04* (2006.01)
*F16B 5/06* (2006.01)
(Continued)

(52) U.S. Cl.
CPC .............. *F16B 5/0642* (2013.01); *H05K 1/144* (2013.01); *H05K 7/14* (2013.01); *H05K 1/141* (2013.01);
(Continued)

(58) Field of Classification Search
CPC ................... Y10T 403/7045; Y10T 403/7049; Y10T 403/7061; Y10T 403/7062; Y10T 403/7069; H05K 2201/2018; H05K 2201/2036; H05K 2203/167; H05K 2201/042; H05K 1/141; H05K 1/144; H05K 7/14; B23K 3/087; B25B 11/007; F16B 5/0642
USPC ................ 403/364, 372, 373, 374.4; 269/903
See application file for complete search history.

(56) References Cited

U.S. PATENT DOCUMENTS 3,777,052 A   12/1973  Fegen
4,750,090 A * 6/1988  Abe .............................. 361/741
(Continued)

FOREIGN PATENT DOCUMENTS

EP   0744886 A1   11/1996
JP   S5927651 Y2   8/1984
(Continued)

OTHER PUBLICATIONS

International Search Report and Written Opinion (in Japanese with English Translation) for PCT/JP2013/000789, mailed Apr. 2, 2013; ISA/JP.
(Continued)

*Primary Examiner* — Gregory Binda
*Assistant Examiner* — Nahid Amiri
(74) *Attorney, Agent, or Firm* — Harness, Dickey & Pierce, P.L.C.

(57) ABSTRACT

A structure for fixing a first substrate and a second substrate, which are connected by an inter-substrate connector and fixed and overlapped each other with a space, comprises, a spacer member that is disposed between the first substrate and the second substrate, and maintains a space between the first substrate and the second substrate at a predetermined distance; a pressing portion that presses the second substrate toward the first substrate; and a locking member that is fixed in the first substrate.

7 Claims, 6 Drawing Sheets

(51) Int. Cl.
*H05K 7/14* (2006.01)
*H05K 1/14* (2006.01)

(52) U.S. Cl.
CPC .. *H05K 2201/042* (2013.01); *H05K 2201/2018* (2013.01); *H05K 2201/2036* (2013.01); *H05K 2203/167* (2013.01); *Y10T 403/7062* (2015.01)

(56) References Cited

U.S. PATENT DOCUMENTS

| | | | |
|---|---|---|---|
| 7,120,024 B2 * | 10/2006 | Watanabe et al. | 361/704 |
| 7,318,978 B2 * | 1/2008 | Sakuma et al. | 429/61 |
| 7,663,886 B2 * | 2/2010 | Aoki et al. | 361/715 |
| 7,964,808 B2 * | 6/2011 | Seo et al. | 200/5 R |
| 2009/0088007 A1 * | 4/2009 | Tsai | 439/67 |
| 2010/0165583 A1 * | 7/2010 | Lin et al. | 361/748 |
| 2010/0218684 A1 * | 9/2010 | Etter et al. | 99/288 |
| 2011/0061919 A1 * | 3/2011 | Hwang et al. | 174/260 |

FOREIGN PATENT DOCUMENTS

| | | |
|---|---|---|
| JP | H04103676 U | 9/1992 |
| JP | H05079988 U | 10/1993 |
| JP | H06053674 A | 2/1994 |
| JP | H08316664 A | 11/1996 |
| JP | H1168353 A | 3/1999 |
| JP | 2004103687 A | 4/2004 |
| JP | 2006339206 A | 12/2006 |
| JP | 2007299435 A | 11/2007 |
| JP | 2007335820 A | 12/2007 |
| JP | 2008039517 A | 2/2008 |
| JP | 2008270234 A | 11/2008 |

OTHER PUBLICATIONS

Office Action dated Jun. 2, 2015 in corresponding Japanese Application No. 2012-100011.

* cited by examiner

STRUCTURE FOR FIXING SUBSTRATE

CROSS REFERENCE TO RELATED APPLICATIONS

This application is a U.S. National Phase Application under 35 U.S.C. 371 of International Application No. PCT/JP2013/000789 filed on Feb. 14, 2013 and published in Japanese as WO 2013/161142 A1 on Oct. 31, 2013. This application is based on and claims the benefit of priority from Japanese Patent Application No. 2012-100011 filed on Apr. 25, 2012. The entire disclosures of all of the above applications are incorporated herein by reference.

TECHNICAL FIELD

The present disclosure relates to a structure for fixing substrates where a first substrate and a second substrate, which are connected by inter-substrate connectors, are fixed so as to be overlapped to each other with a space left in between.

BACKGROUND ART

In the past, inter-substrate connectors that directly connect two substrates are used in order to downsize devices and provide additional circuits in a print substrate.

As a method of fixing the two substrates connected by the inter-substrate connectors into a case (a housing), there is a method where screw holes or the like are formed in each of the substrates, and the substrates are fixed one by one to the case. In addition, there is a method where the two substrates are fixed with each other in advance by screwing and then fixed to the case. The latter fixing method is preferably employed when an inspection process is carried out before the two substrates are assembled to the case, or when a small-size subsidiary substrate is fixed on a large-size main substrate.

When the two substrates are fixed with each other in such a manner that the inter-substrate connectors are fitted in advance and then the substrates are fixed by screwing, a stress is caused thereby to twist the inter-substrate connectors due to a rotating moment associated with the screwing. By such a stress, soldered portions of the inter-substrate connecters may be damaged with time.

So, in order to suppress the twisting stress that acts on the inter-substrate connectors, a substrate fixing structure has been proposed. In the structure, the rotating moment directly propagates to the substrates is suppressed by providing a clamping piece and a receiving piece and then fixing one of the substrates so as to clamp the substrate with those pieces (See Patent Literature 1).

In addition, a method where the two substrates are fixed with each other by employing a fixing tool of synthesized resin, without using screws, has been proposed (See Patent Literature 2, Patent Literature 3).

In the fixing structure of Patent Literature 1, more than one small parts are necessary for every screw hole, which may lead to a problem in that assembling procedures become troublesome.

In addition, creep may occur with time in resin parts described in Patent Literature 2 and Patent Literature 3, especially when exposed to a high temperature environment such as a vehicle interior. This may cause backlash, which leads to reduced contact reliability in electrical connection, or to greater vibrating sounds especially in apparatuses mounted in vehicles.

PRIOR ART LITERATURES

Patent Literature

Patent Literature 1: JP-A-2008-270234
Patent Literature 2: JP-Y-B-59-27651
Patent Literature 3: U.S. Pat. No. 3,777,052

SUMMARY OF INVENTION

It is an object of the present disclosure to provide a structure for fixing substrates that can be readily assembled and suppress occurrence of backlash or damage of inter-substrate connectors.

According to an aspect of the present disclosure, a structure for fixing a first substrate and a second substrate, which are connected by an inter-substrate connector, overlapped with a space and fixed with each other, includes: a spacer member that is disposed between the first substrate and the second substrate, and maintains a space between the first substrate and the second substrate at a predetermined distance; a pressing portion that presses the second substrate toward the first substrate; and a locking member that is fixed in the first substrate.

In such a fixing structure, a rotating force about an axis perpendicular to the surfaces of the substrates can be suppressed from acting on the inter-substrate connectors. In addition, a force in parallel with the surfaces of the substrates can be suppressed from acting on the inter-substrate connectors. Moreover, a load applied to the inter-substrate connectors can be reduced. Therefore, damages of the inter-substrate connectors can be suppressed. Moreover, even when the spacer member and the locking member are supposedly formed of a synthesis resin and creeps are caused with time, gaps originating from the creeps can be rectified by pressing with the pressing member, thereby to suppress backlash from taking place.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

In the following, embodiments of a substrate unit to which a substrate fixing structure according to this disclosure is adapted will be explained along with the drawings.

EXAMPLES

(1) Configuration of Substrate Unit

Figure 1:
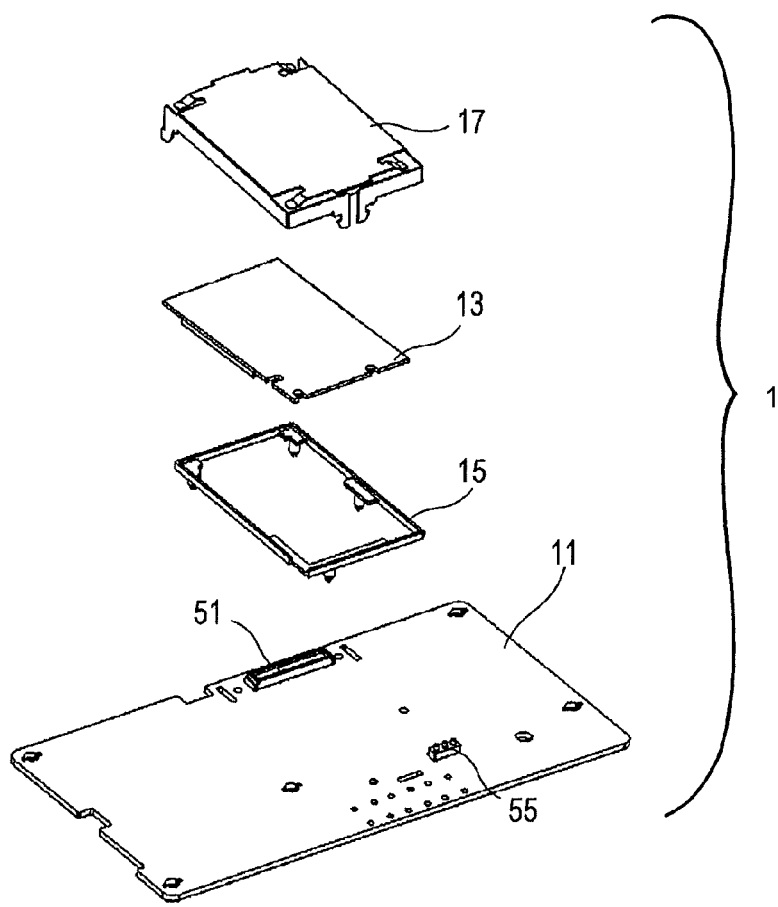
FIG. 1 is a perspective view illustrating a first substrate, a second substrate, a spacer member, and a locking member, which constitute a substrate unit of an example of the present disclosure.

A substrate unit 1 of this example is composed of a first substrate 11, a second substrate 13, a spacer member 15, and a locking member 17, as illustrated in FIG. 1. Incidentally, the first substrate 11 is an example of a first substrate in this disclosure, and the second substrate 13 is an example of a second substrate in this disclosure.

Figure 2A:
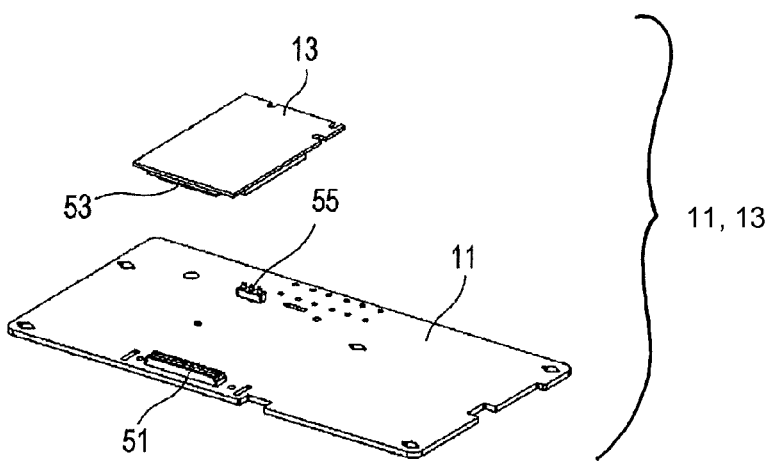
FIG. 2A and FIG. 2B are views for explaining a connecting state of the first substrate and the second substrate, with the spacer member and the locking member omitted.
Figure 2B:
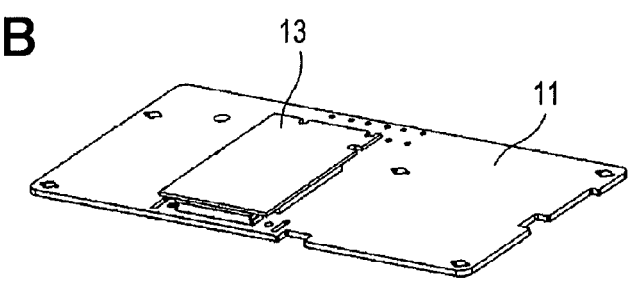

As illustrated in FIGS. 2A and 2B, the first substrate 11 and the second substrate 13 are electrically connected by connecting an inter-substrate connector 51 provided in the first substrate 11 and an inter-substrate connector 53 provided in the second substrate 13. In addition, the electrical connection is made even by a pogo pin 55 provided in the first substrate 11. In these drawings, the spacer member 15 and the locking member 17 are omitted in order to clearly illustrate a state where the first substrate 11 and the second substrate 13 are connected.

Incidentally, while printed wirings or the like are formed in the first substrate 11 and the second substrate 13, the printed wirings are omitted in each drawing of this example.

Figure 2C:
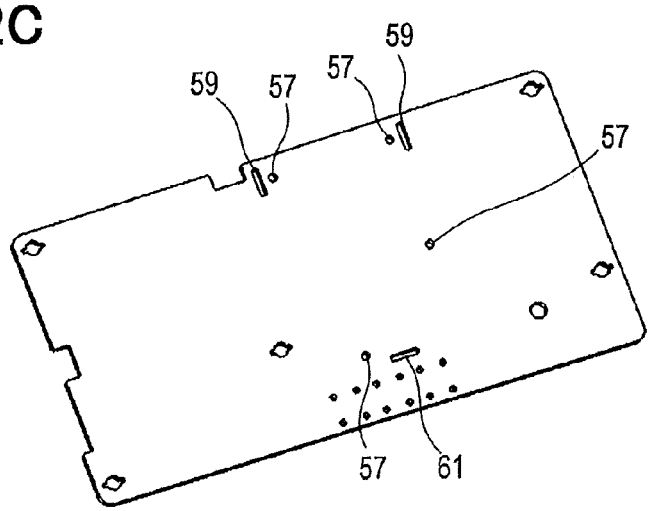
FIG. 2C is a perspective view of the first substrate.

As illustrated in FIG. 2C, holes 57 and slits 59, 61, all of which penetrate the first substrate 11, are formed in the first substrate 11. The holes 57 are formed in the first substrate 11 in four locations with spaces therebetween. In addition, two slits 59 are formed so that the longitudinal directions thereof are in parallel with each other; and the slit 61 is formed so that the longitudinal direction thereof is perpendicular to the slits 59.

Incidentally, the slits 59, 61 are examples of the through-holes in this disclosure. The holes 57 may be concave portions, which do not penetrate the substrate, rather than the through-holes.

Figure 3A:
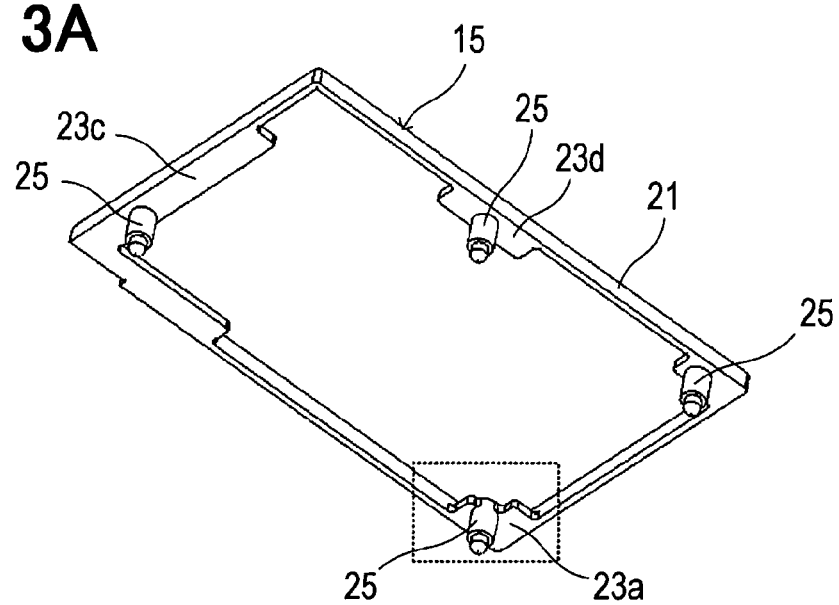
FIG. 3A is a perspective view illustrating the spacer member seen from below.
Figure 3B:
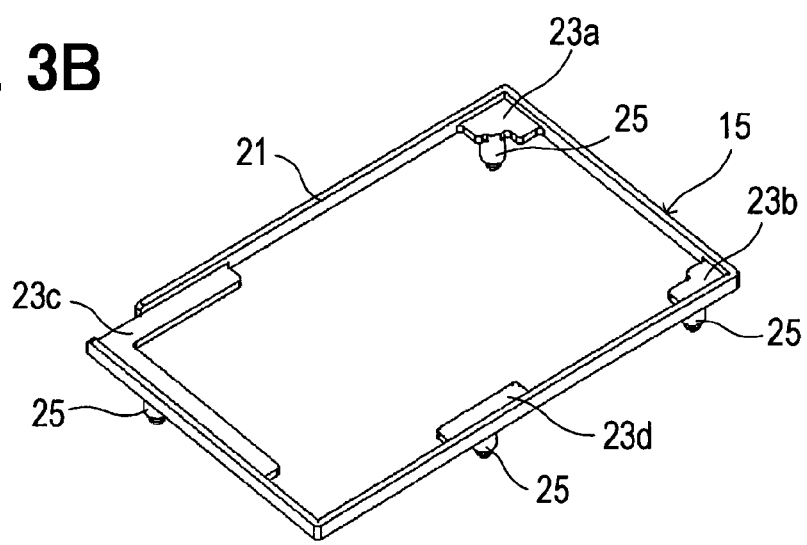
FIG. 3B is a perspective view illustrating the spacer member seen from above.
Figure 3C:
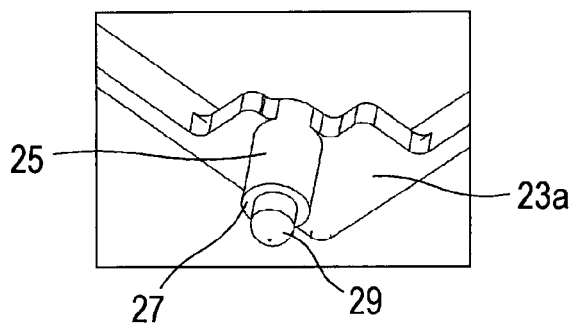
FIG. 3C is an enlarged view of a broken lined portion of FIG. 3A.

The spacer member 15 is illustrated in FIGS. 3A through 3C. The spacer member 15 is disposed between the first substrate 11 and the second substrate 13, and maintains a space between these substrates at a predetermined distance. The spacer member 15, which is formed of a synthesis resin, has a frame portion 21 of such a shape that four elongated plate members are combined into a cylinder body having a rectangular cross section, abutting portions 23a through 23d that have shapes of plane and extend inwardly from the rectangular frame member 21, and four leg portions 25 that extend from the corresponding abutting portions 23a through 23d.

The frame portion 21 is formed so as to be along with side surfaces or an outer periphery of the second substrate 13. In addition, the frame portion 21 is formed so that an inner area of the frame portion 21 is slightly larger than the outer periphery of the second substrate 13. Therefore, the second substrate 13 can be housed inside the frame portion 21, so that, when housed, a certain or larger clearance is created between the frame portion 21 and the outer periphery of the second substrate 13. Incidentally, the frame portion 21 is one example of a side wall portion in this disclosure.

Among the above-described abutting portions 23a through 23d, the abutting portions 23a through 23c are formed at corresponding corners of the frame portion 21, and the abutting portion 23d is formed in a center or the vicinity of one side of the rectangle. The abutting portions 23a through 23d abut the second substrate 13, specifically the outer periphery or the vicinity of the second substrate 13 in order to ensure wider areas where the wirings are printed and parts are mounted.

The frame portion 21 partly discontinues in the corner or the vicinity where the abutting portion 23c is formed. When a part of the second substrate 13 extends outward from the frame portion 21 or when a part of the side surfaces of the second substrate 13 needs to be open, or the like, the frame portion 21 may discontinue as described. Incidentally in such a case, it is preferable when a discontinued part is configured so as to be connected by the abutting portions or the like, because the entire shape can be maintained.

Each of the abutting portions 23a through 23d is formed so that the abutting portions 23a through 23d are positioned on an identical plane at one end portion in a height direction of the frame portion 21 (a direction perpendicular to the rectangular face formed by the frame portion 21). In the following, explanations are made for the spacer member 15, referring to the side of the one end portion as a lower side, and to the side of the other end portion as an upper side. However, this is intended to designate an up-and-down direction for the convenience of the explanation, and does not limit a usage mode.

The leg portions 25 are of a shape of circular cylinder having a length in a lower direction or a direction connecting the first substrate 11 and the second substrate 13, as illustrated in FIG. 3C. Naturally, the leg portions 25 may have a shape except the circular cylinder, such as a shape of rectangular cylinder. In extending ends of the leg portions 25, end faces 27 are formed which come in contact with the first substrate 11. Moreover, protrusions 29 project downwardly from the corresponding end faces 27. The leg portions 25 are provided in the corresponding four locations. Each of the protrusions 29 can be inserted into corresponding one of the holes 57 at the four locations in the first substrate 11.

Incidentally, the locations and the number of the abutting portions 23a through 23d are not limited to the above-described ones. However, the abutting portions 23a through 23d can be arbitrarily provided in positions without possibilities of interfering with the locking member 17 or mounted parts on the first substrate 11 and the second substrate 13.

Figure 4A:
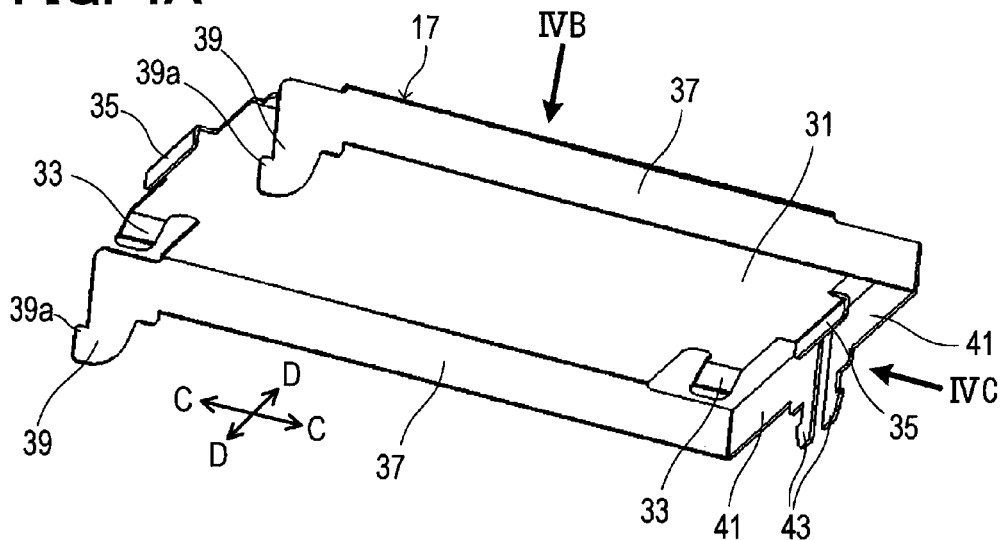
FIG. 4A is a perspective view of the locking member.
Figure 4B:
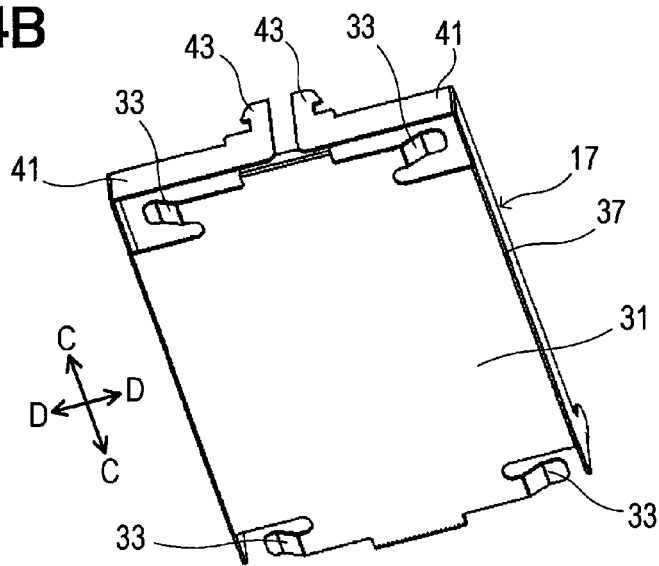
FIG. 4B is a perspective view seen along a direction of an arrow IVB of FIG. 4A.
Figure 4C:
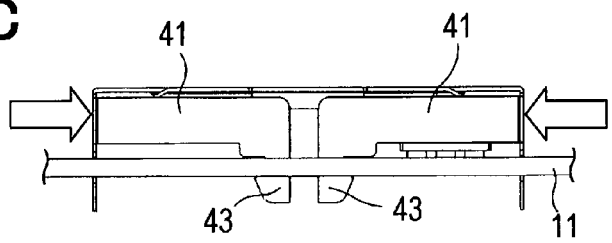
FIG. 4C is a side view seen along a direction of an arrow IVC of FIG. 4A.

The locking member 17 is illustrated in FIG. 4A through 4C. The locking member 17 is formed by performing press-working on a sheet metal in the form of thin plate, and has a plane portion 31, side surface portions 37, and the like.

The plane portion 31 is of a shape of substantial rectangular. In both ends thereof along a first direction (a direction of arrows C in FIG. 4A and FIG. 4B), bent portions 35 are respectively formed which are bent perpendicular to the plane portion 31. In the following, explanations are made for the locking member 17, referring to this bending direction as a lower direction. This lower direction is the same direction as the lower direction regarding the frame portion 21 in a state where the substrate unit 1 is assembled.

In addition, at four locations in both ends in a second direction (a direction of arrows D) perpendicular to the first direction and in both ends of the plane portion 31 in the first direction, plate springs 33, each of which is of a shape of arm that extends inclined downwardly, are respectively formed.

The side surface portions 37 bend downwardly so as to be perpendicular to the plane portion 31, in both ends of the plane portion 31 in the second direction, and of a shape of elongated plate having a length along the first direction. At one end portion along the longitudinal direction of each of the side surface portions 37, a locking portion 39 is formed so as to extend downwardly. On the one end side of the locking portion 39, a claw 39a is formed.

In addition, second side surfaces 41 are formed respectively in the other end sides of the corresponding side surface portions 37 so as to bend perpendicularly toward the opposing ones of the side surface portions 37. Distal ends of the second side surfaces 41 reach the center or the vicinity thereof along the second direction of the plane portion 31. At the distal ends thereof, fixing claws 43 are respectively formed so as to extend downwardly. Incidentally, an extending length of the second side surface 41 is not particularly limited, but may be shorter than the one described above.

A space between the two bent portions 35 is set slightly longer than the longitudinal length of the frame portion 21. In addition, a space between the two side surface portions 37 is set longer than the shorter length direction of the frame portion 21. Therefore, the frame portion 21 can be housed between these bent portions 35 and between the side surface portions 37.

(2) Substrate Unit Assembling

In the following, procedures of assembling the substrate unit 1 are explained. Incidentally, these procedures are one example only and, naturally, other procedures may be taken for the assembling.

Figure 5A:
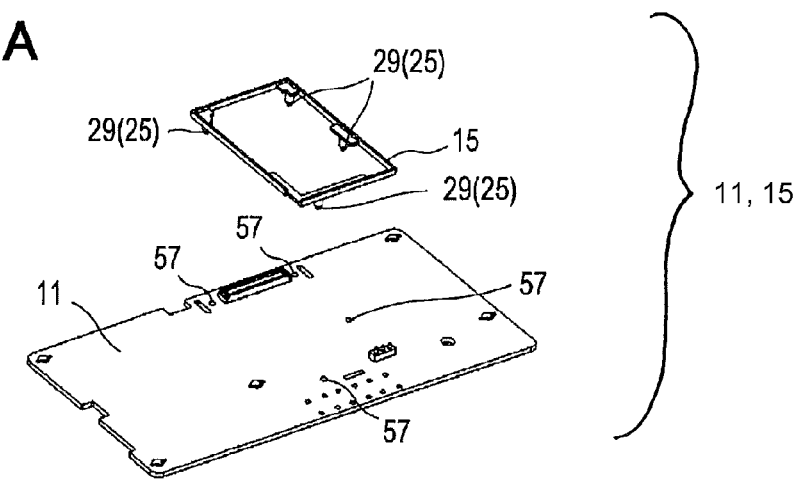
FIG. 5A is a view for explaining assembling procedures, and illustrates a state before assembling.
Figure 5B:
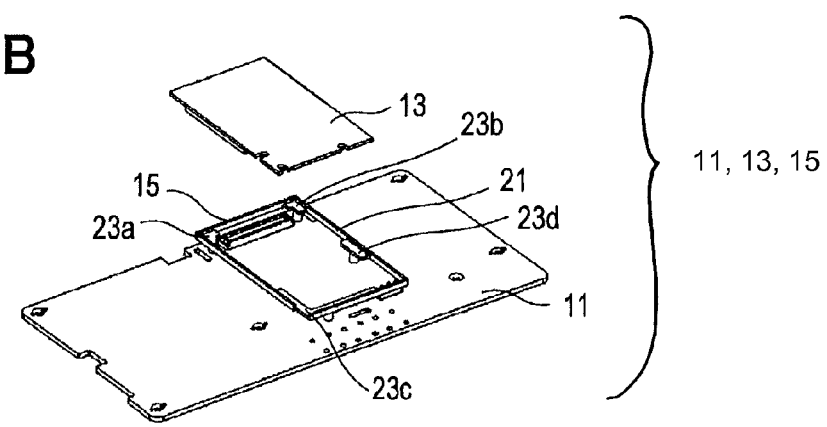
FIG. 5B is a view for explaining assembling procedures, and illustrates a state where the spacer member is attached to the first substrate.

As illustrated in FIG. 5A, FIG. 5B, the protrusions 29 of the leg portions 25 in the spacer member 15 are inserted into the corresponding holes 57 of the first substrate 11, thereby to dispose the spacer member 15 in an appropriate position on the first substrate 11.

Figure 5C:
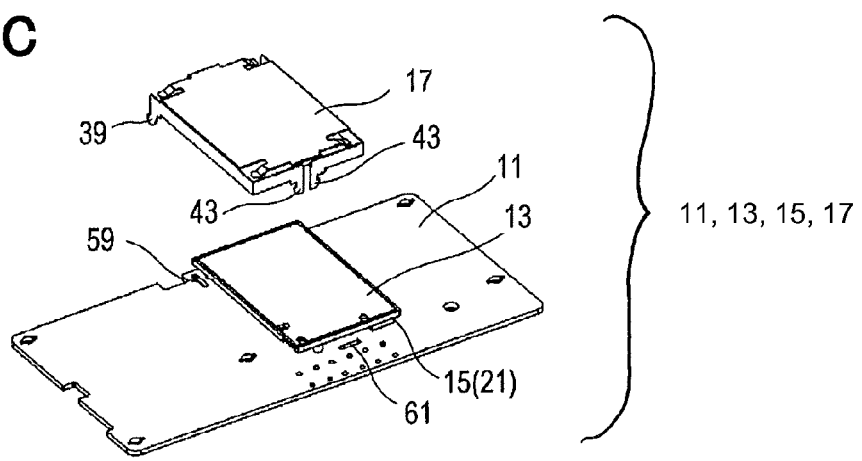
FIG. 5C is a view for explaining assembling procedures, and illustrates a state where the second substrate is attached to the spacer member.

Next, the second substrate 13 is placed on the spacer member 15, as illustrated in FIG. 5C. The second substrate 13 is disposed on the abutting portions 23a through 23d of the spacer member 15. The frame portion 21 is formed so as to be slightly larger than the second substrate 13 as described above, so that the second substrate 13 is disposed in an appropriate position by housing the second substrate 13 within the frame portion 21.

Incidentally, the inter-substrate connector 53 in the second substrate 13 (not illustrated in FIG. 5A through FIG. 5C) is connected to the inter-substrate connector 51 in the first substrate 11, at this time. In addition, in this state, the pogo pin 55 comes in contact with the second substrate 13 in an appropriate position.

Figure 6A:
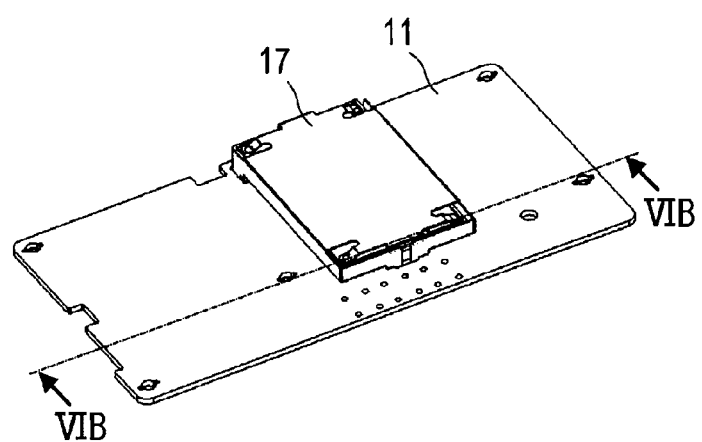
FIG. 6A is a perspective view illustrating a state where the first substrate, the second substrate, the spacer member, and the locking member have been assembled.

Next, the locking member 17 is lapped over the second substrate 13 and the spacer member 15, and thus attached to the first substrate 11, which leads to a state illustrated in FIG. 6A. Specifically first of all, the two locking pieces 39 that extend toward the first substrate 11 are inserted into the corresponding slits 59.

Next, the fixing claws 43 are inserted into the slit 61. At this time, such insertion is made while a space between the fixing claws 43 is narrowed by pressing the side surface portions 37 along directions of arrows in FIG. 4C. By releasing the pressing, the space between the fixing claws 43 becomes greater, and thus the fixing claws 43 lock onto peripheral portions of the slit 61. In addition, the claws 39a of the locking pieces 39 lock onto peripheral portions of the slits 59. With these, the locking member 17 is fixed on the first substrate 11.

In such a manner, assembling of the substrate unit 1 is completed, in which the spacer member 15 is disposed on the first substrate 11; the second substrate 13 is disposed on the spacer member 15; and the locking member 17 that covers the spacer member 15 and the second substrate 13 is fixed on the first substrate 11.

The first substrate 11 and the second substrate 13 that are connected by the inter-substrate connecters in the substrate unit 1 are fixed with each other by the locking member 17, while being overlapped with a space left therebetween by the spacer member 15.

Figure 6B:
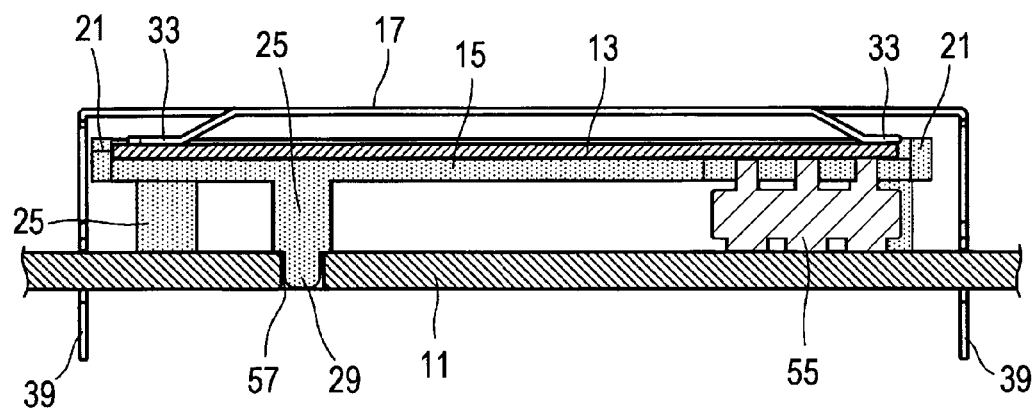
FIG. 6B is a cross-sectional view taken along a VIB-VIB line in FIG. 6A.

Specifically, the plate springs 33 of the locking member 17 press the second substrate 13 toward the first substrate 11 as illustrated in FIG. 6B, according to which the second substrate 13 and the spacer member 15 are suppressed from moving in a direction departing from the first substrate 11. In addition, because the protrusions 29 of the spacer member 15 are inserted into the corresponding holes 57 and additionally the second substrate 13 is housed within the frame portion 21, the first substrate 11 and the second substrate 13 are restricted from moving against each other in a direction along primary faces thereof.

Incidentally, by pressing the side surface portions 37 in the arrow directions of FIG. 4C thereby to narrow the space between the fixing claws 43, the fixing claws 43 can be pulled away from the slit 61, which allows the locking member 17 to be removed from the first substrate 11. Accordingly, the second substrate 13 and the spacer member 15 are removable.

(3) Effects

Because the substrate unit 1 of this example uses no screws for fixing the two substrates, no twisting stress due to screwing occurs. Therefore, a load applied to the inter-substrate connectors 51, 53 can be reduced, thereby to suppress damages such as peel-off of solder for fixing the inter-substrate connectors to the substrates. In addition, even when creep happens in the spacer member 15, gaps are rectified by pressing with the plate springs 33 of the locking member 17, thereby to suppress backlash from taking place.

In addition, because the first substrate 11 and the second substrate 13 are suppressed from largely deviating by the spacer member 15, a load due to such large deviation can be suppressed from acting on the inter-substrate connectors 51, 53.

In addition, because the plate springs 33 press the four corners of the second substrate 13 toward the first substrate 11, the second substrate 13 can be entirely pressed in well balance. With this, a load originating from inclination of the second substrate 13 against the first substrate 11 can be suppressed from acting on the inter-substrate connectors 51, 53. In addition, the spacer 15 is suppressed from being locally deformed.

Moreover, because the locking member 17 is fixed onto the first substrate 11 by the locking pieces 39 and the fixing claws 43 without using screws, attaching work can be extremely simply performed.

Modified Examples

While the example of this disclosure has been explained above, this disclosure is not at all limited to the above example, but various configurations are naturally feasible as long as they belong to a technical scope of this disclosure.

For example, while a configuration where the spacer member 15 is formed of a synthesis resin and the locking member 17 is formed of a sheet metal member has been exemplified in the above example, other materials can be used. For example, the spacer member 15 may be formed of a metal or a ceramic material and the locking member 17 may be formed of a synthesis resin.

In addition, while a configuration where the frame portion 21 encloses a major part of the periphery of the second substrate 13 has been exemplified, the frame portion 21 does not necessarily widely enclose the periphery, but may be formed only in part, as long as the frame portion 21 abuts the side surfaces of the second substrate 13 thereby to restrict movement of the second substrate 13. In addition, while a configuration where the abutting portions 23a through 23d are formed so as to be isolated from one another has been exemplified, each of them may be continuous.

Moreover, in the locking member 17, a pressing portion that presses the second substrate 13 is not necessarily the plate spring. For example, a configuration can be contemplated where a center of the plane portion 31 is dented toward the second substrate 13 and thus the bottom surface of the dent presses the second substrate 13. In addition, there may be a configuration where an elastic member such as a helical spring and a highly-elastic elastomer is attached on a reverse surface of the plane portion 31 so that the elastic member presses the second substrate 13.

In addition, in the above example, a configuration has been exemplified where the plate springs 33 have the same shape, an inclination angle and a diameter may be modified for each of the plate springs 33 in order to change pressing forces. For example, a configuration is contemplated where an inclination angle of the plate spring 33 positioned above the pogo pin 55 is increased thereby to enhance the pressing force.

Moreover, a fixing portion that fixes the spacer member 15 and the second substrate 13 may be provided in advance. After the spacer member 15 and the second substrate 13 are assembled and thus integrated by the fixing portion, the integrated part is disposed on the first substrate 11 and finally the locking member 17 is attached.

The above disclosure includes the following configurations.

According to an aspect of the present disclosure, a structure for fixing a first substrate and a second substrate, which are connected by an inter-substrate connector, overlapped with a space and fixed with each other, includes: a spacer member that is disposed between the first substrate and the second substrate, and maintains a space between the first substrate and the second substrate at a predetermined distance; a pressing portion that presses the second substrate toward the first substrate; and a locking member that is fixed in the first substrate.

In such a fixing structure, by pressing the second substrate toward the first substrate by the pressing portion with the spacer member intervened therebetween, the two substrates are fixed with each other. Therefore, differently from a case where the two substrates are fixed by screws, no twisting force is applied. In addition, because a positional relationship of the two substrates are not strictly fixed, differently from the case where the screws are used, a stress applied along a direction in parallel with the surfaces of the substrates can be readily released. Therefore, a rotating force about an axis perpendicular to the substrate surfaces can be suppressed from acting on the inter-substrate connectors. In addition, a force in parallel with the substrate surfaces can be suppressed from acting on the inter-substrate connectors. Moreover, a load applied to the inter-substrate connectors can be reduced. Accordingly, damages of the inter-substrate connectors can be suppressed. Furthermore, even when the spacer member and the locking member are supposedly formed of a synthesis resin and creeps occur with time, gaps originated from the creeps can be rectified by pressing with the pressing member, thereby to suppress backlash from taking place. In addition, because a fixing method of the locking member to the first substrate is not limited, they can be attached by, for example, generic screws. Incidentally, even when the screws are used for fixing the locking member and the first substrate, because a stress due to the screwing is not directly applied to the second substrate, a greater load is not applied to the inter-substrate connectors by the twisting stress. The above-described spacer member can be formed of, for example, a synthesis resin.

Alternatively, the spacer member may comprise: at least one leg portion having a predetermined length along a direction connecting the first substrate and the second substrate; and a side wall portion disposed along at least a part of a side surface of the second substrate. The side wall portion abuts the side surface to restrict a relative movement of the second substrate and the spacer member in a direction in parallel with a primary surface of the second substrate. According to such a fixing structure, the relative movement of the second substrate and the spacer member can be restricted by the side wall portion, thereby to suppress the second substrate from moving away from an appropriate position.

Alternatively, the first substrate may comprise one or more holes or concave portions. The leg portion comprises a protrusion at an end of the leg portion. The protrusion is inserted into the one or more holes or concave portions to restrict a relative movement of the first substrate and the spacer member in a direction in parallel with a primary surface of the first substrate. In such a fixing structure, because a relative movement between the first substrate and the second substrate in the direction along the primary faces of the substrates can be restricted by the spacer member, a load generated by the movement of these substrates is suppressed from acting on the inter-substrate connectors.

Alternatively, the locking member may be a metal member having a thin plate shape. The pressing portion is a plate spring. By forming the locking member of the metal member, a high elastic force can be given to the plate spring.

Alternatively, the plate spring may press the second substrate at a plurality of positions, which are spaced apart from each other. In such a fixing structure, by pressing the second substrate at plural positions, variations of the pressing force applied to the second substrate can be reduced, thereby to stably fix the second substrate to the first substrate.

Alternatively, the locking member may include a plurality of locking pieces that extend toward the first substrate. Each of the locking pieces includes a stopper that fixes the locking member to the first substrate. The first substrate further includes a plurality of through holes, which correspond to the locking pieces, respectively. The locking pieces penetrate the corresponding through holes, and the stoppers are locked at edge portions of the through holes, respectively, so that the locking member is fixed in the first substrate. In such a fixing structure, because the locking member can be locked and thus fixed to the first substrate, attaching work can be extremely simply performed.

Alternatively, the locking member may have a box shape having an opening portion. The pressing member is coupled with the locking member on an upper surface of the box shape. Each locking piece is disposed in a side surface of the box shape.

Alternatively, the second substrate may be disposed between the locking member and the first substrate. The second substrate is accommodated in the box shape of the locking member.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A structure for fixing a first substrate and a second substrate, the structure comprising:
    a spacer member that is disposed between the first substrate and the second substrate, and maintains a space between the first substrate and the second substrate at a predetermined distance;
    a pressing portion that presses the second substrate toward the first substrate; and
    a locking member that is fixed in the first substrate,
    wherein the first substrate and the second substrate that are connected by an inter-substrate connector are overlapped with a space and fixed with each other;
    wherein the spacer member comprises:
    at least one leg portion having a predetermined length along a direction connecting the first substrate and the second substrate; and
    a side wall portion disposed along at least a part of a side surface of the second substrate, and
    wherein the side wall portion abuts the side surface to restrict a relative movement of the second substrate and the spacer member in a direction in parallel with a primary surface of the second substrate.

2. The structure for fixing the substrates according to claim 1,
    wherein the first substrate comprises one or more holes or concave portions,
    wherein the leg portion comprises a protrusion at an end of the leg portion, and
    wherein the protrusion is inserted into the one or more holes or concave portions to restrict a relative movement of the first substrate and the spacer member in a direction in parallel with a primary surface of the first substrate.

3. The structure for fixing the substrates according to claim 1,
    wherein the locking member is a metal member having a thin plate shape, and
    wherein the pressing portion is a plate spring.

4. The structure for fixing the substrates according to in claim 3,
    wherein the plate spring presses the second substrate at a plurality of positions, which are spaced apart from each other.

5. The structure for fixing the substrates according to claim 1,
    wherein the locking member includes a plurality of locking pieces that extend toward the first substrate,
    wherein each of the locking pieces includes a stopper that fixes the locking member to the first substrate,
    wherein the first substrate further includes a plurality of through holes, which correspond to the locking pieces, respectively,
    wherein the locking pieces penetrate the corresponding through holes, and the stoppers are locked at edge portions of the through holes, respectively, so that the locking member is fixed in the first substrate.

6. The structure for fixing the substrates according to claim 5,
    wherein the locking member has a box shape having an opening portion,
    wherein the pressing portion is coupled with the locking member on an upper surface of the box shape, and
    wherein each locking piece is disposed in a side surface of the box shape.

7. The structure for fixing the substrates according to claim 6,
    wherein the second substrate is disposed between the locking member and the first substrate, and
    wherein the second substrate is accommodated in the box shape of the locking member.

* * * * *